(12) United States Patent
Ooya et al.

(10) Patent No.: US 6,385,258 B1
(45) Date of Patent: May 7, 2002

(54) VITERBI DECODER FOR USE IN A MOBILE COMMUNICATION SYSTEM

(75) Inventors: Takashi Ooya, Tokyo; Yoshiharu Yagi, Shizuoka, both of (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/429,972

(22) Filed: Oct. 29, 1999

(30) Foreign Application Priority Data

Oct. 29, 1998 (JP) .......................................... 10-324490

(51) Int. Cl.[7] .............................. H03D 1/00; H04L 27/06
(52) U.S. Cl. ...................... 375/341; 714/794; 714/795; 714/796
(58) Field of Search ................................. 375/262, 316, 375/340, 341; 714/794, 795, 796

(56) References Cited

U.S. PATENT DOCUMENTS

| | | | | |
|---|---|---|---|---|
| 4,583,078 A | * | 4/1986 | Shenoy et al. | 341/51 |
| 5,027,374 A | * | 6/1991 | Rossman | 375/341 |
| 5,859,861 A | * | 1/1999 | Oh | 375/341 |
| 5,907,586 A | * | 5/1999 | Katsuragawa et al. | 370/342 |
| 5,960,011 A | * | 9/1999 | Oh | 375/262 |
| 5,982,822 A | * | 11/1999 | Hatakeyama | 375/341 |
| 6,094,739 A | * | 7/2000 | Miller et al. | 714/792 |
| 6,317,472 B1 | * | 11/2001 | Choi et al. | 375/262 |
| 6,327,316 B1 | * | 12/2001 | Ikeda | 375/341 |

FOREIGN PATENT DOCUMENTS

| | | |
|---|---|---|
| JP | 8-84082 | 3/1996 |
| JP | 8-340262 | 12/1996 |
| JP | 9-232973 | 9/1997 |
| JP | 10-107651 | 4/1998 |

* cited by examiner

*Primary Examiner*—Stephen Chin
*Assistant Examiner*—Lenny Jiang
(74) *Attorney, Agent, or Firm*—Hutchins, Wheeler & Dittmar

(57) ABSTRACT

A Viterbi decoder which conducts maximum likelihood decoding of a convolutional code based on Viterbi algorithms including a branch metric generation circuit for generating a branch metric based on input data, an ACS execution circuit for conducting ACS processing using a generated branch metric, a path memory for storing a path selected by ACS processing, a path metric holding circuit for storing new path metric data generated by ACS processing and returning the data again to the ACS execution circuit, and an address generation circuit for conducting generation of a memory address and memory switching control in the path metric holding circuit, and a number of states counter for instructing the branch metric generation circuit and the address generation circuit on a processing cycle, the branch metric generation circuit executing the branch metric generation processing in multiplexing and the ACS execution circuit executing the ACS processing in a multiplicity corresponding to the branch metric generation processing.

14 Claims, 5 Drawing Sheets

VITERBI DECODER FOR USE IN A MOBILE COMMUNICATION SYSTEM

BACKGROUND OF THE INVENTION

1. Field of the Invention

The present invention relates to a Viterbi decoder for use in a mobile communication system and the like to decode a convolutional code by a Viterbi decoding system for conducting maximum likelihood decoding based on Viterbi algorithms.

2. Description of the Related Art

One of common decoding systems for decoding a convolutional code is the Viterbi decoding system which conducts maximum likelihood decoding based on Viterbi algorithms. A Viterbi decoder for decoding a convolutional code according to the Viterbi decoding system is employed in a mobile communication system and the like because of its high capability in correcting random errors caused on a communication line in a communication system.

A Viterbi decoder conducts, with respect to applied data, ACS processing (addition, comparison, selection) of adding branch metrics output from a branch metric generation means and path metrics read from a path metric memory means, comparing them and selecting a smaller one, stores path metric data in the path metric memory means and stores selection information on a remaining path of the ACS processing in a path memory.

Since a conventional Viterbi decoder has only one system of a branch metric generation means and a means for conducting ACS processing, at the decoding of applied data, the above-described processing should be executed as many times as the number of states.

Also, because path metric data should be read from a path metric memory means twice at the time of the ACS processing, a conventional Viterbi decoder conducts reading of path metric data from one path metric memory in two times for one ACS processing.

As described above, since a conventional Viterbi decoder has only one system of the branch metric generation means and the means for conducting ACS processing, the decoder should conduct the above-described processing as many times as the number of states at the time of decoding applied data, requiring enormous time for the processing.

Another shortcoming is that since a conventional Viterbi decoder conducts reading of path metric data from one path metric memory in two times for one ACS processing, one ACS processing at the minimum needs a time of reading path metric data twice from the path metric memory means, which makes more speed-up impossible.

SUMMARY OF THE INVENTION

An object of the present invention is to overcome the above-described conventional shortcomings and provide a Viterbi decoder which enables speed-up of processing by multiplexing generation of a branch metric and ACS processing, as well as reducing the number of times of reading of path metric data from a path metric memory at the time of the ACS processing.

According to one aspect of the invention, a Viterbi decoder for conducting maximum likelihood decoding of a convolutional code based on Viterbi algorithms, comprises branch metric generation means for generating a branch metric based on input data, ACS execution means for conducting ACS processing using the branch metric generated by the branch metric generation means, path memory means for storing a path selected by the ACS processing, path metric holding means for storing new path metric data generated by the ACS processing and returning the new data again to the ACS execution means, address generation means for conducting generation of a memory address and memory switching control in the path metric holding means, and number of states counter means for instructing the branch metric generation means and the address generation means on a processing cycle, wherein the branch metric generation means executes the branch metric generation processing in multiplexing, and the ACS execution means executes the ACS processing in a multiplicity corresponding to the branch metric generation processing.

In the preferred construction, the path metric holding means comprises two systems of memories for storing the path metric data, and writes the path metric data output from the ACS execution means divisionally to the two systems of memories, as well as reading the path metric data from the two systems of memories to distribute and output to the ACS execution means.

In another preferred construction, the path metric holding means comprises two systems of memories for storing the path metric data, first switching means for writing the path metric data output from the ACS execution means divisionally to the two systems of memories, and second switching means for reading the path metric data from the two systems of memories to distribute and output to the ACS execution means.

In another preferred construction, the ACS execution means comprises as many ACS blocks as the number corresponding to the multiplicity which execute ACS processing of adding the branch metrics received from the branch metric generation means and the path metric data read from the path metric holding means, comparing addition results and selecting a smaller path.

In another preferred construction, the ACS execution means comprises as many ACS blocks as the number corresponding to the multiplicity which execute ACS processing of adding the branch metrics received from the branch metric generation means and the path metric data read from the path metric holding means, comparing addition results and selecting a smaller path, and the path metric holding means comprises two systems of memories for storing the path metric data, writes the path metric data output from the ACS execution means divisionally to the two systems of memories, and reads the path metric data from the two systems of memories to distribute to the ACS blocks of the ACS execution means.

In another preferred construction, the ACS execution means comprises as many ACS blocks as the number corresponding to the multiplicity which execute ACS processing of adding the branch metrics received from the branch metric generation means and the path metric data read from the path metric holding means, comparing addition results and selecting a smaller path, and the path metric holding means comprises two systems of memories for storing the path metric data, first switching means for writing the path metric data output from the ACS execution means divisionally to the two systems of memories, and second switching means for reading the path metric data from the two systems of memories to distribute to the ACS blocks of the ACS execution means.

In another preferred construction, the ACS execution means comprises, as many as the number corresponding to the multiplicity, addition means for adding the branch metrics received from the branch metric generation means and the path metric data read from the path metric holding means, and comparison and selection means for comparing addition results obtained by the addition means to select a smaller path, the addition means and the comparison and selection means executing processing in parallel to each other.

In another preferred construction, the ACS execution means comprises, as many as the number corresponding to the multiplicity, addition means for adding the branch metrics received from the branch metric generation means and the path metric data read from the path metric holding means, and comparison and selection means for comparing addition results obtained by the addition means to select a smaller path, the addition means and the comparison and selection means executing processing in parallel to each other, and the path metric holding means comprises two systems of memories for storing the path metric data, first switching means for writing the path metric data output from the ACS execution means divisionally to the two systems of memories, and second switching means for reading the path metric data from the two systems of memories to distribute to the addition means of the ACS execution means.

According to another aspect of the invention, a Viterbi decoder for conducting maximum likelihood decoding of a convolutional code based on Viterbi algorithms, comprises a branch metric generation circuit for generating a branch metric based on input data, an ACS execution circuit for conducting ACS processing using the branch metric generated by the branch metric generation circuit, a path memory for storing a path selected by the ACS processing, a path metric holding circuit for storing new path metric data generated by the ACS processing and returning the new data again to the ACS execution circuit, an address generation circuit for conducting generation of a memory address and memory switching control in the path metric holding circuit, and a number of states counter for instructing the branch metric generation circuit and the address generation circuit on a processing cycle, wherein the branch metric generation circuit executes the branch metric generation processing in multiplexing, and the ACS execution circuit executes the ACS processing in a multiplicity corresponding to the branch metric generation processing.

In the preferred construction, the path metric holding circuit comprises two systems of memories for storing the path metric data, a first switch for writing the path metric data output from the ACS execution circuit divisionally to the two systems of memories, and a second switch for reading the path metric data from the two systems of memories to distribute and output to the ACS execution circuit.

In another preferred construction, the ACS execution circuit comprises as many ACS blocks as the number corresponding to the multiplicity which execute ACS processing of adding the branch metrics received from the branch metric generation circuit and the path metric data read from the path metric holding circuit, comparing addition results and selecting a smaller path.

In another preferred construction, the ACS execution circuit comprises as many ACS blocks as the number corresponding to the multiplicity which execute ACS processing of adding the branch metrics received from the branch metric generation circuit and the path metric data read from the path metric holding circuit, comparing addition results and selecting a smaller path, and the path metric holding circuit comprises two systems of memories for storing the path metric data, a first switch for writing the path metric data output from the ACS execution circuit divisionally to the two systems of memories, and a second switch for reading the path metric data from the two systems of memories to distribute to the ACS blocks of the ACS execution circuit.

In another preferred construction, the ACS execution circuit comprises, as many as the number corresponding to the multiplicity, an addition circuit for adding the branch metrics received from the branch metric generation circuit and the path metric data read from the path metric holding circuit, and a comparison and selection circuit for comparing addition results obtained by the addition circuit to select a smaller path, the addition circuit and the comparison and selection circuit executing processing in parallel to each other.

In another preferred construction, the ACS execution circuit comprises, as many as the number corresponding to the multiplicity, an addition circuit for adding the branch metrics received from the branch metric generation circuit and the path metric data read from the path metric holding circuit, and a comparison and selection circuit for comparing addition results obtained by the addition circuit to select a smaller path, the addition circuit and the comparison and selection circuit executing processing in parallel to each other, and the path metric holding circuit comprises two systems of memories for storing the path metric data, a first switch for writing the path metric data output from the ACS execution circuit divisionally to the two systems of memories, and a second switch for reading the path metric data from the two systems of memories to distribute to the addition circuit of the ACS execution circuit.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings.

DESCRIPTION OF THE PREFERRED EMBODIMENT

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 1:
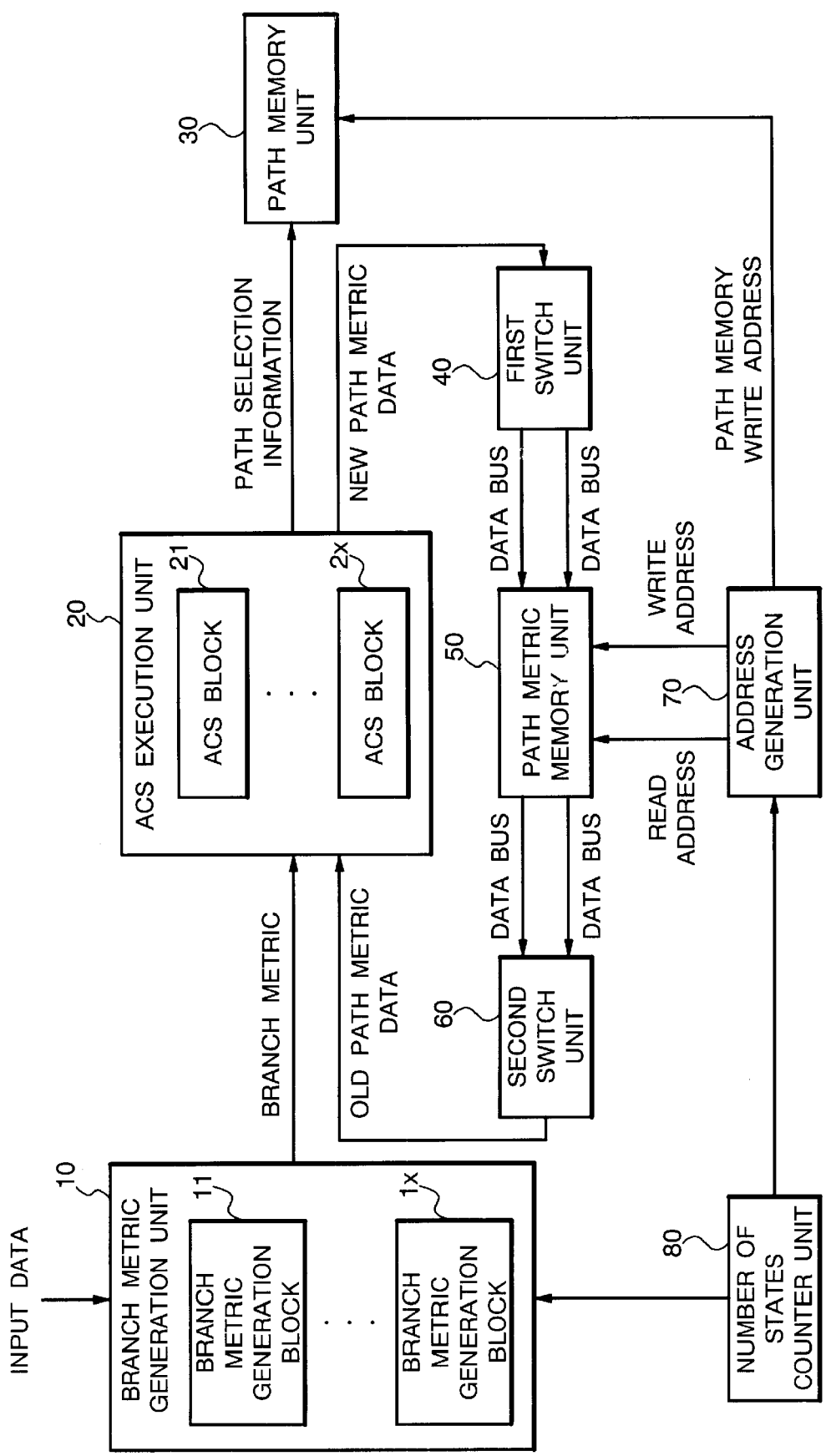
FIG. 1 is a block diagram showing structure of a Viterbi decoder according to one embodiment of the present invention.

FIG. 1 is a block diagram showing structure of a Viterbi decoder according to one embodiment of the present invention. With reference to FIG. 1, the Viterbi decoder of the present embodiment includes a branch metric generation unit (circuit) 10 for generating a branch metric from input data, an ACS execution unit (circuit) 20 for conducting ACS processing using a generated branch metric, a path memory unit 30 for storing a path selected by the ACS processing, a first switch unit 40 for storing new path metric data generated by the ACS processing and returning the same again to the ACS execution unit 20, a path metric memory unit 50 and a second switch unit 60, an address generation unit (circuit) 70 for conducting address generation and memory switching control in the path metric memory unit 50, and a number of states counter unit (circuit) 80 for instructing the branch metric generation unit 10 and the address generation unit 70 on a processing cycle.

In FIG. 1, illustration is made only of a characteristic part of the structure of the present embodiment and that of the remaining common part is omitted.

In the above-described structure, the branch metric generation unit 10 has a plurality of branch metric generation blocks 11–1x for generating a branch metric. The branch metric generation blocks 11–1x generate a branch metric of one state (a state where input data is "0" or a state where the input data is "1") based on the input data and outputs the branch metric to the ACS execution unit 20.

The ACS execution unit 20 has as many ACS blocks 21–2x for executing ACS processing as the number of the branch metric generation blocks 11–1x. The ACS blocks 21–2x add branch metrics received from the branch metric generation unit 10 and old path metric data read from the path metric memory unit 50, compare the same, select a smaller one and output the selection to the first switch unit 40 as new path metric data. In addition, the unit 20 outputs a path selected by the relevant ACS processing as path selection information to the path memory unit 30.

The path memory unit 30 receives input of path selection information (selected path) output from the ACS execution unit 20 and stores the same.

The first switch unit 40 sends the new path metric data sent from the ACS execution unit 20 to the path metric memory unit 50 while switchedly using one of the first data bus and the second data bus.

Figure 4:
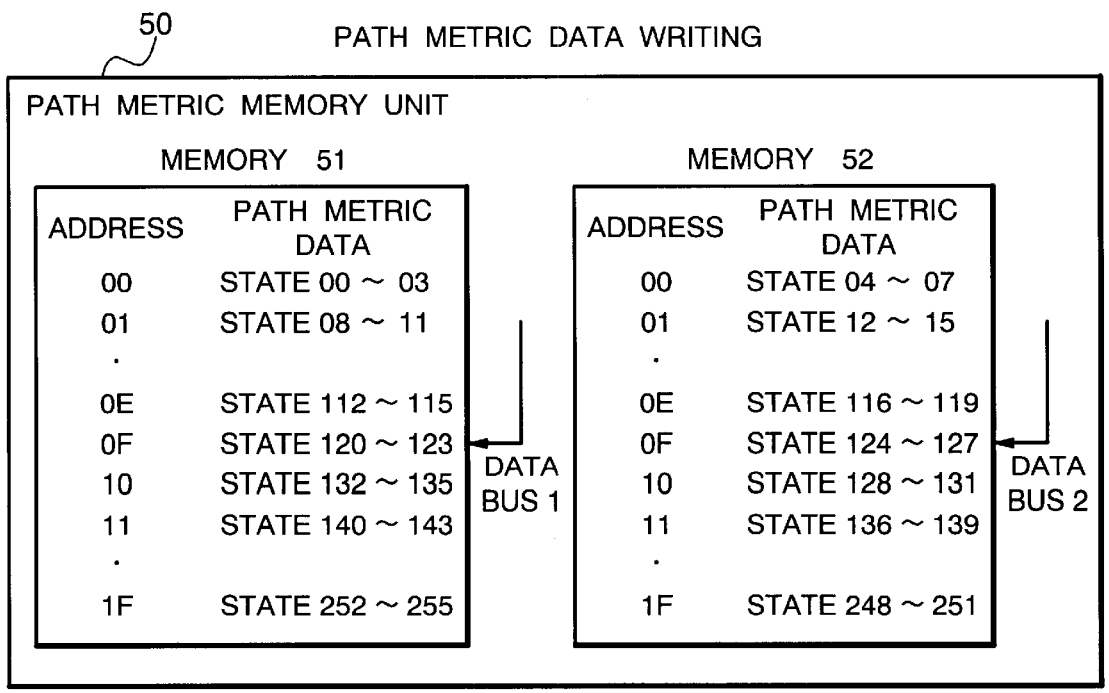
FIG. 4 is a diagram showing a format of memories constituting a path metric memory unit in the present embodiment, which is a format at the time of writing to the path metric memory.

The path metric memory unit 50, as illustrated in FIG. 4, includes two systems of memories 51 and 52. The memories 51 and 52 are each divided into the face and the back, and accordingly the path metric memory unit 50 is divided into four sections as a whole. The memories 51 and 52 are memories for storing path metric data and each stores path metric data of four states. The faces and the backs of the memories 51 and 52 indicate that the memories 51 and 52 are each divided for the side of writing path metric data and the side of reading the same. Constituting the path metric memory unit 50 by the two systems of the memories 51 and 52 each storing path metric data of four states enables a data width which allows path metric data of a number x of states to be simultaneously written in a unit time.

The second switch unit 60 distributes path metric data (old path metric data) sent from the path metric memory unit 50 through the third data bus or the fourth data bus to an appropriate ACS block of the ACS execution unit 20.

The address generation unit 70 generates an address for the reading and writing of the path metric memory unit 50, as well as conducting switching between the faces and the backs of the memories 51 and 52. The unit 70 also generates a write address and write timing of the path memory unit 30.

The number of states counter unit 80 is a counter for counting a time, starting at the value "0" until reaching a value obtained by dividing the number of states of path metric data by a multiplicity of the processing at the branch metric generation unit 10 and the ACS execution unit 20. When the number of states counter unit 80 counts up to the value, the branch metric generation unit 10 and the address generation unit 70 recognize the end of the processing cycle for the relevant input data to start processing for the subsequent input data.

Figure 6:
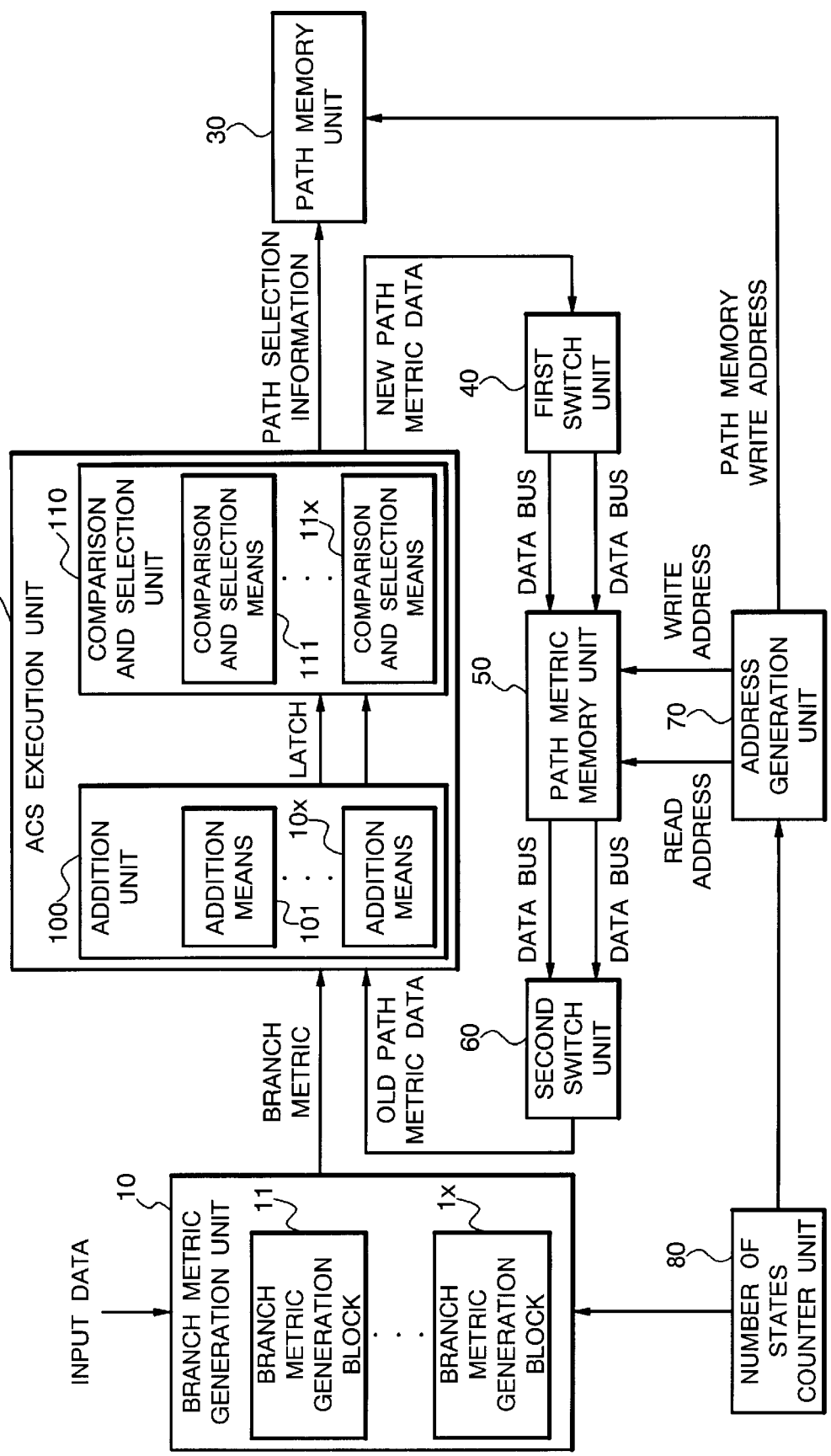
FIG. 6 is a block diagram showing structure of a Viterbi decoder according to another embodiment of the present invention.

FIG. 6 is a block diagram showing structure of a Viterbi decoder according to another embodiment of the present invention.

With reference to FIG. 6, the Viterbi decoder of the present embodiment includes a branch metric generation unit 10 for generating a branch metric from input data, an ACS execution unit 20 for conducting ACS processing using a generated branch metric, a path memory unit 30 for storing a path selected by the ACS processing, a first switch unit 40 for storing new path metric data generated by the ACS processing and returning the same again to the ACS execution unit 20, a path metric memory unit 50 and a second switch unit 60, an address generation unit 70 for conducting address generation and memory switching control in the path metric memory unit 50, and a number of states counter unit 80 for instructing the branch metric generation unit 10 and the address generation unit 70 on a processing cycle.

In the foregoing structure, since the components except the ACS execution unit 20 are the same as their counterparts in the first embodiment shown in FIG. 1, the same reference numerals are allotted thereto to omit their description. In FIG. 6, illustration is made only of a characteristic part of the structure of the present embodiment and that of the remaining common part is omitted.

The ACS execution unit 20 is mainly composed of a an addition unit 100 for adding branch metrics received from the branch metric generation unit 10 and old path metric data read from the path metric memory unit 50 and a comparison and selection unit 110 for comparing addition results obtained by the addition unit 100 and selecting a smaller one.

The addition unit 100 has as many addition means 101–10x as the number of branch metric generation blocks 11–1x and execute the above addition processing in multiplexing. The comparison and selection unit 110 has as many comparison and selection means 111–11x as the number of the branch metric generation blocks 11–1x and the addition means 101–10x to execute the above-described comparison and selection processing in multiplexing.

The addition unit 100 and the comparison and selection unit 110 execute the processing independently and latch at a point of change of a reference clock to realize the ACS processing. In other words, the addition, the comparison and the selection processing are not executed collectively but the addition processing by the addition unit 100 and the comparison and selection processing by the comparison and selection unit 110 are executed individually in parallel to each other.

The ACS execution unit 20 shown in FIG. 1 collectively conducts the ACS processing of adding applied branch metrics and old path metrics, comparing them and selecting a smaller one. In this case, as the number of bits of branch metric data or path metric data is increased, more time will be required for the ACS processing in question, so that a reference clock should be set to be slower as a whole to cope with the processing.

Realizing the ACS processing by conducting the addition processing and the comparison and selection processing individually and in parallel to each other as in the present embodiment and latching the processing at a point of change of a reference clock enables a time required for the ACS processing to be reduced, which eliminates the need of setting a reference clock to be slower to cope with the processing.

Next, with a specific example of operation according to the first embodiment shown in FIG. 1, the embodiment will be described in detail. The Viterbi decoder of the present embodiment is structured as illustrated in FIG. 1 and generates path metrics of several states in multiplexing within a unit time from a time n. The time n is counted by the number of states counter unit 80.

Figure 2:
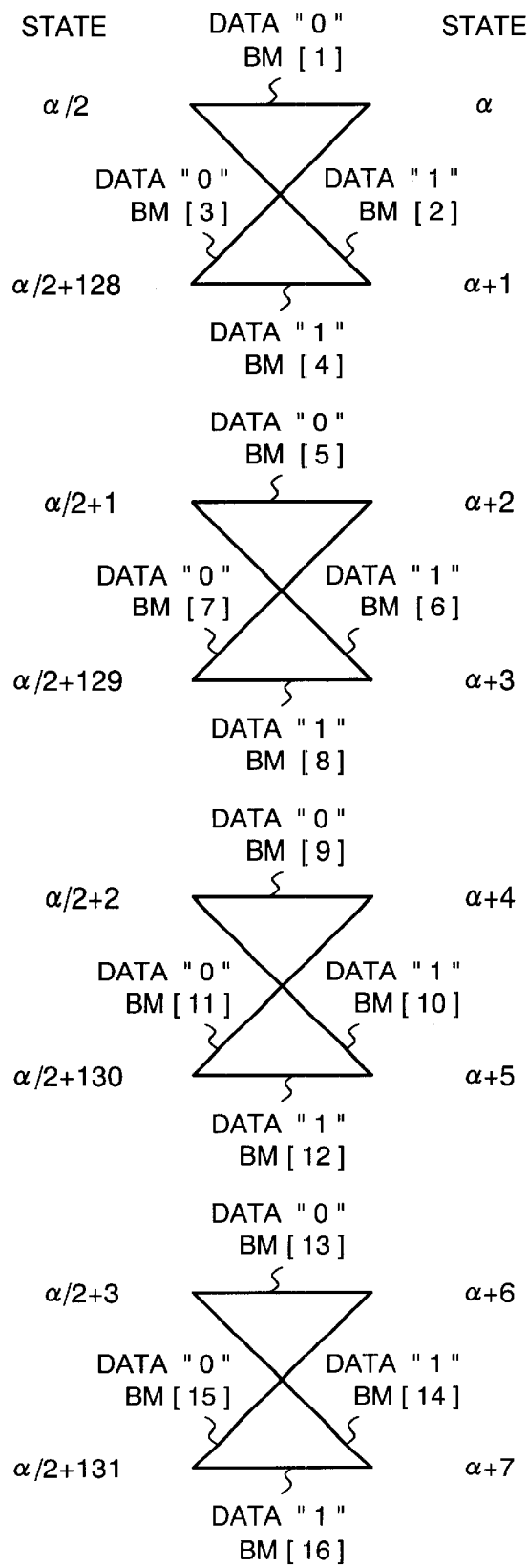
FIG. 2 is a diagram showing a path metric which can be processed in a unit time in a case where the ACS processing is conducted in eight-multiplexing in the present embodiment.

FIG. 2 is a diagram showing a path metric in a case where the constraint length K is 9 and the multiplicity is 8, that is, where the ACS processing is executed in eight-multiplexing. Accordingly, the branch metric generation unit 10 is provided with eight branch metric generation blocks 11–18, while the ACS execution unit 20 is also provided with eight ACS blocks 21–28. In FIG. 2, $\alpha$ denotes a coefficient indicative of a state and is assumed to be 8n.

With reference to FIG. 2, when the current state is $\alpha/2$ or $\alpha/2+128$ and input data is "0", the transition to the state a takes place. When the current state is $\alpha/2$ or $\alpha/2+128$ and the input data is "1", the transition to the state $\alpha+1$ occurs. Similarly, at the time n, transition from the current state to the eight states shown in FIG. 2 occurs according to whether the input data is "0" or "1".

In FIG. 2, [1]–[16] denote branch metrics, and [1], [3], [5], [7], [9], [11], [13] and [15] represent branch metrics at a time when data "0" is applied at a certain state. [2], [4], [6], [8], [10], [12], [14] and [16] represent branch metrics at a time when data "1" is applied at a certain state. In other words, each branch metric is generated according to a polynomial for generation, a coding rate, a state and input data.

Figure 3:
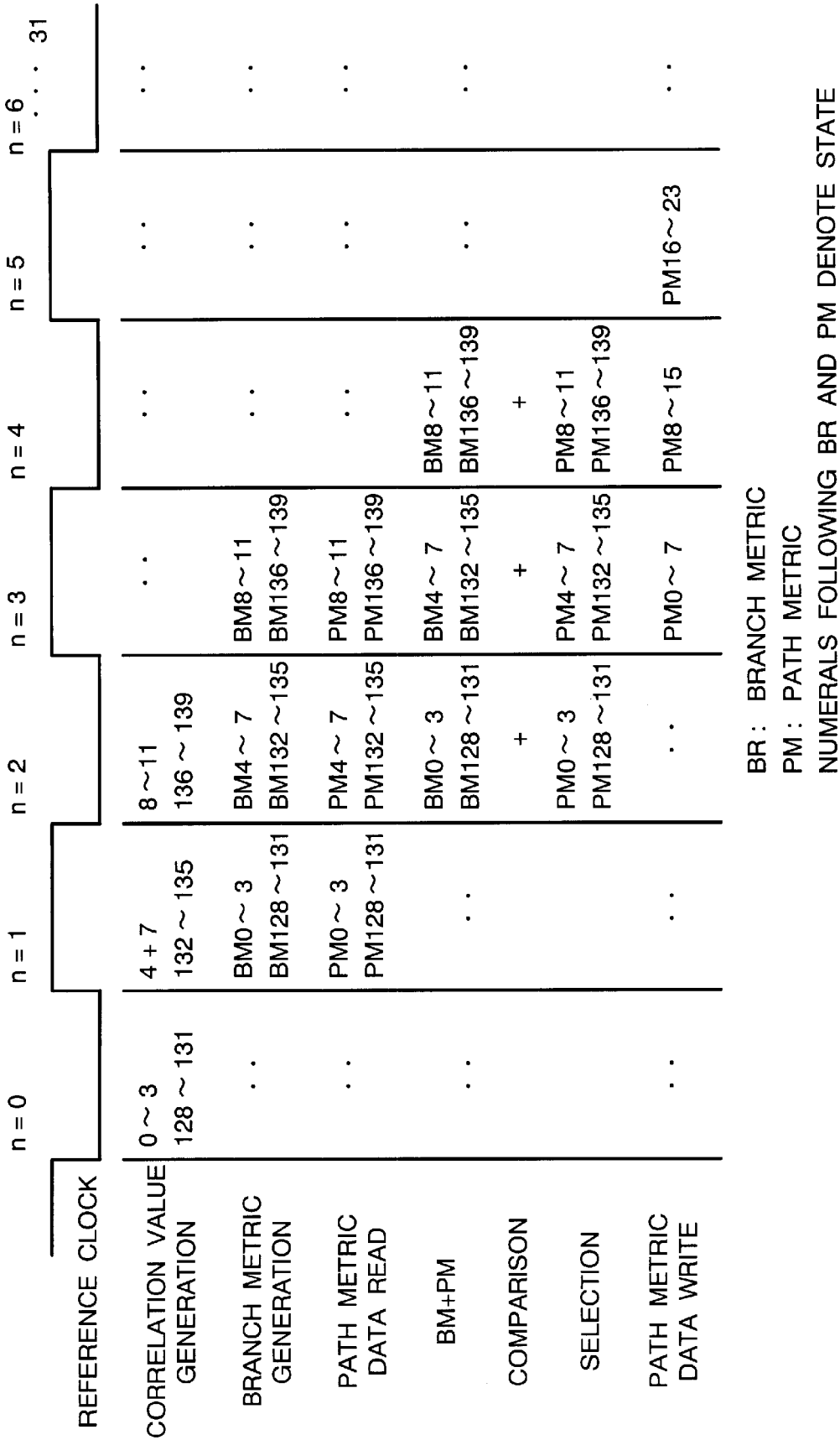
FIG. 3 is a timing chart showing operation of the present embodiment.

FIG. 3 is a timing chart showing the entire operation of the Viterbi decoder according to the present embodiment. Described in FIG. 3 are the contents of each of operations at the Viterbi decoder in a predetermined three-unit time, generation of a correlation value of a state, branch metric generation, path metric data reading, addition, comparison and selection of branch metrics and path metrics, and path metric data writing.

First, the branch metric generation blocks 11–18 of the branch metric generation unit 10 at the Viterbi decoder shown in FIG. 1 generate a branch metric at the time of the transition from the current state to the subsequent state as described above. The branch metric generation block 11 generates the branch metrics [1] and [3], while the branch metric generation block 12 generates the branch metrics [2] and [4]. In the same manner, the branch metric generation blocks 13–18 generate two each of the branch metrics [5], [6], [7], [8], [9], [10], [11], [12], [13], [14], [15] and [16]. These branch metrics are generated according to a count value of the number of states of counter unit 80, a polynomial for generation and input data.

Because the branch metric generation blocks 11–18 generate branch metrics whose states are different from each other, branch metrics of as many states as the number of the branch metric generation blocks 11–18 can be generated. In the present embodiment, since ACS processing is conducted in eight-multiplexing, the branch metric generation blocks 11–18 simultaneously generate branch metrics of eight states (at one state, two kinds of states where data "0" is applied and where data "1" is applied).

With reference to FIG. 3, at a position of time n=0, correlation values of eight states, 0, 1, 2, 3, 128, 129, 130 and 131 are obtained and at a position of time n=1, a value as large as a coding rate is added to generate branch metrics. In addition, at the position of time n=1, correlation values of the states, 4, 5, 6, 7, 132, 133, 134 and 135 are obtained to generate branch metrics at a position of time n=2. Thus, when the number of states counter unit 80 starts counting, the branch metric generation blocks 11–18 generate branch metrics every time the counter counts up.

The ACS blocks 21–28 of the ACS execution unit 20 read, at the position of time n=1, the old path metric data [0], [1], [2], [3], [128], [129], [130] and [131]. Then, at the position of time n=2, the blocks select path metric data alternately from among [0] –[3] and [128]–[131] and select every other branch metric to add them, like adding the read path metric data [0] and the branch metric [1], adding the path metric data [128] and the branch metric [3], adding the path metric data [1] and the branch metric [5], and adding the path metric data [129] and the branch metric [7].

Then, the unit 20 compares the above-described addition results between two paths which will make a transit to the same state, selects a path whose correlation value is larger and outputs the selection to the first switch unit 40 (see FIG. 2). The unit 20 also outputs the then selection path information (selected path) to the path memory unit 30.

Next, the ACS blocks 21–28, at the position of time n=2, select the path metric data alternately from among [4]–[7] and [132]–[135] and select every other branch metric to add them, like adding the path metric data [4] and the branch metric [1] and adding the path metric data [132] and the branch metric data [3].

The first switch unit 40 outputs the path metric data [0], [1], [2] and [3] applied at a position of time n=3 to the first data bus of the path metric memory unit 50 and outputs the path metric data [4], [5], [6] and [7] to the second data bus. Switching of a data bus is conducted such that when path metric data whose states are 128 to 255 is applied, the path metric data of the states 128, 129, 130 and 131 is output to the first data bus and the path metric data of the states 132, 133, 134 and 135 is output to the second data bus.

The path metric memory unit 50 has the memories 51 and 52 each having two sides, face and back. The first data bus and the memory 51 are connected and the second data bus and the memory 52 are connected. Then, the data switchedly output from the first switch unit 40 is written into the memories 51 and 52 of the path metric memory unit 50. How path metric data is written into the path metric memory unit 51 is shown in FIG. 4.

With reference to FIGS. 3 and 4, at the position of time n=3, the path metric data [0], [1], [2] and [3] is written at the address 00 of the memory 51 in the path metric memory unit 50 and the path metric data [4], [5], [6] and [7] is written at the address 00 of the memory 52. At a position of time n=4, the path metric data [8], [9], [10] and [11] is written at the address 01 of the memory 51 and the path metric data [12], [13], [14] and [15] is written at the address 01 of the memory 52. In the same manner, every time the state counter unit 80 counts up, path metric data is sequentially written, so that at a position of time n=19, the first data bus and the second data bus are switched at the first switch unit 40 to write the path metric data [132], [133], [134] and [135] at the address 10 of the memory 51 and the path metric data [128], [129], [130] and [131] at the address 10 of the memory 52.

Figure 5:
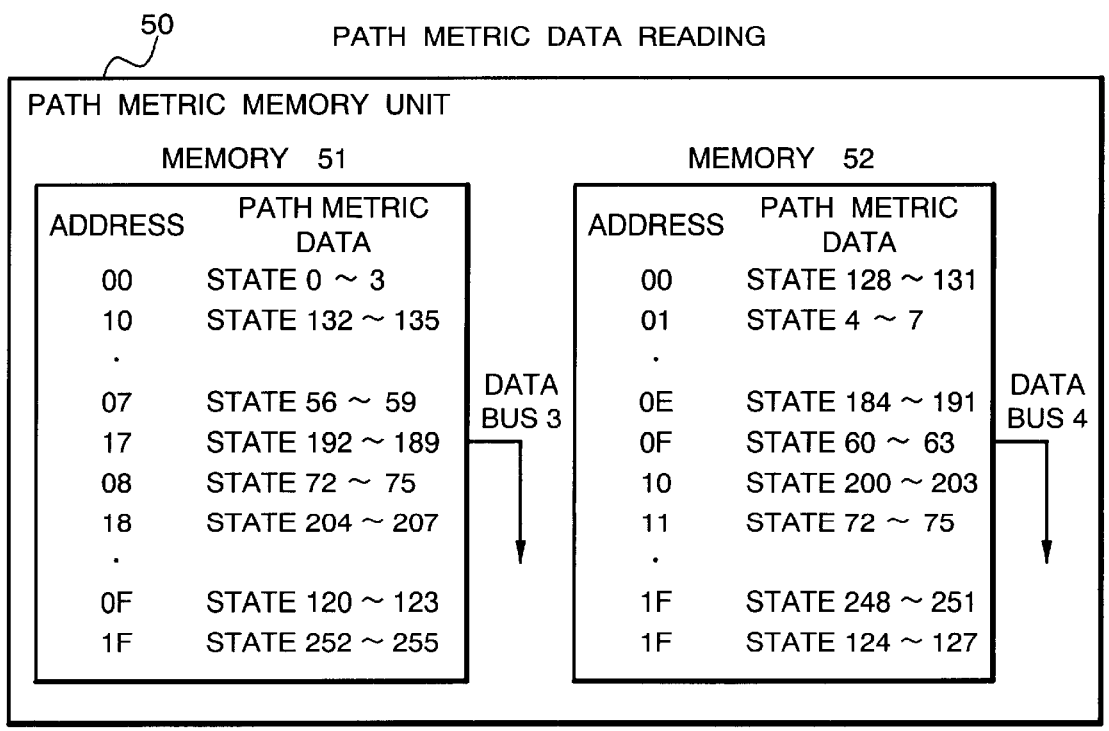
FIG. 5 is a diagram showing a format of the memories constituting the path metric memory unit in the present embodiment, which is a format at the time of reading from the path metric memory.

As to reading of path metric data from the path metric memory unit 50, with reference to FIGS. 3 and 5, since the path metric data [0], [1], [2], [3], [128], [129], [130] and [131] is to be read at the position of time n=1, the path metric data is read with the address of the memory 51 set to 00 and the address of the memory 52 set to 10. In addition, since the path metric data [4], [5], [6], [7], [132], [133], [133], [134] and [135] is to be read at the position of time n=2, reading is conducted with the address of the memory 51 set to 10 and the address of the memory 52 set to 00.

The second switch unit 60 distributes eight path metric data applied through the third data bus and the fourth data bus to the ACS blocks 21–28 of the ACS execution unit 20.

The address generation unit 70 generates, according to the formats of the memories 51 and 52 of the path metric memory unit 50 shown in FIGS. 4 and 5, a write address and a read address of the path metric memory unit 50 in question to conduct switching between the face and the back of the memories 51 and 52, as well as generating an address of the path memory unit 30.

As described in the foregoing, with the Viterbi decoder of the present invention, multiplexing of the ACS processing enables drastic reduction of a time required for processing.

In particular, as illustrated in FIG. 3, since conducting processing as pipeline processing and sub-dividing each processing (dividing into numbers of processing blocks to reduce a processing time of each block) enable a reference clock to be shortened, achieving higher-speed processing.

The Viterbi decoder of the present invention has the memory of the path metric memory unit divided into two systems to conduct writing, at the writing of new path metric data output from the multiplexed ACS execution unit into the path metric memory unit, while switching data to be written into the memory in a predetermined time. Then, at the reading of path metric data from the path metric memory unit, changing an address, as well as switching read data at the time of output to the ACS execution unit necessitate only one path metric data reading from the path metric memory unit for one-time ACS processing and the output of data to the ACS execution unit. Therefore, speed-up of the ACS processing is possible.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A Viterbi decoder for conducting maximum likelihood decoding of a convolutional code based on Viterbi algorithms, comprising:

branch metric generation means for generating a branch metric based on input data;

ACS execution means for conducting ACS processing using said branch metric generated by said branch metric generation means;

path memory means for storing a path selected by the ACS processing;

path metric holding means for storing new path metric data generated by the ACS processing and returning the new data again to said ACS execution means;

address generation means for conducting generation of a memory address and memory switching control in said path metric holding means; and number of states counter means for instructing said branch metric generation means and said address generation means on a processing cycle, wherein said branch metric generation means executes said branch metric generation processing in multiplexing, and said ACS execution means executes the ACS processing in a multiplicity corresponding to said branch metric generation processing.

2. The Viterbi decoder as set forth in claim 1, wherein said path metric holding means comprises two systems of memories for storing said path metric data, and writes said path metric data output from said ACS execution means divisionally to said two systems of memories, as well as reading said path metric data from said two systems of memories to distribute and output to said ACS execution means.

3. The Viterbi decoder as set forth in claim 1, wherein said path metric holding means comprising two systems of memories for storing said path metric data, first switching means for writing said path metric data output from said ACS execution means divisionally to said two systems of memories, and second switching means for reading said path metric data from said two systems of memories to distribute and output to said ACS execution means.

4. The Viterbi decoder as set forth in claim 1, wherein said ACS execution means comprising as many ACS blocks as the number corresponding to said multiplicity which execute ACS processing of adding said branch metrics received from said branch metric generation means and said path metric data read from said path metric holding means, comparing addition results and selecting a smaller path.

5. The Viterbi decoder as set forth in claim 1, wherein said ACS execution means comprises as many ACS blocks as the number corresponding to said multiplicity which execute ACS processing of adding said branch metrics received from said branch metric generation means and said path metric data read from said path metric holding means, comparing addition results and selecting a smaller path, and said path metric holding means comprises two systems of memories for storing said path metric data, writes said path metric data output from said ACS execution means divisionally to said two systems of memories, and reads said path metric data from said two systems of memories to distribute to said ACS blocks of said ACS execution means.

6. The Viterbi decoder as set forth in claim 1, wherein said ACS execution means comprises as many ACS blocks as the number corresponding to said multiplicity which execute ACS processing of adding said branch metrics received from said branch metric generation means and said path metric data read from said path metric holding means, comparing addition results and selecting a smaller path, and said path metric holding means comprising two systems of memories for storing said path metric data, first switching means for writing said path metric data output from said ACS execution means divisionally to said two systems of memories, and second switching means for reading said path metric data from said two systems of memories to distribute to said ACS blocks of said ACS execution means.

7. The Viterbi decoder as set forth in claim 1, wherein said ACS execution means comprises, as many as the number corresponding to said multiplicity, addition means for adding said branch metrics received from said branch metric generation means and said path metric data read from said path metric holding means, and comparison and selection means for comparing addition results obtained by said addition means to select a smaller path, said addition means and said comparison and selection means executing processing in parallel to each other.

8. The Viterbi decoder as set forth in claim 1, wherein said ACS execution means comprises, as many as the number corresponding to said multiplicity, addition means for adding said branch metrics received from said branch metric generation means and said path metric data read from said path metric holding means, and comparison and selection means for comparing addition results obtained by said addition means to select a smaller path, said addition means and said comparison and selection means executing processing in parallel to each other, and said path metric holding means comprising two systems of memories for storing said path metric data, first switching means for writing said path metric data output from said ACS execution means divisionally to said two systems of memories, and second switching means for reading said path metric data from said two systems of memories to distribute to said addition means of said ACS execution means.

9. A Viterbi decoder for conducting maximum likelihood decoding of a convolutional code based on Viterbi algorithms, comprising:

a branch metric generation circuit for generating a branch metric based on input data;

an ACS execution circuit for conducting ACS processing using said branch metric generated by said branch metric generation circuit;

a path memory for storing a path selected by the ACS processing;

a path metric holding circuit for storing new path metric data generated by the ACS processing and returning the new data again to said ACS execution circuit;

an address generation circuit for conducting generation of a memory address and memory switching control in said path metric holding circuit; and a number of states counter for instructing said branch metric generation circuit and said address generation circuit on a processing cycle, wherein said branch metric generation circuit executes said branch metric generation processing in multiplexing, and said ACS execution circuit executes the ACS processing in a multiplicity corresponding to said branch metric generation processing.

10. The Viterbi decoder as set forth in claim 9, wherein said path metric holding circuit comprising two systems of memories for storing said path metric data, a first switch for writing said path metric data output from said ACS execution circuit divisionally to said two systems of memories, and a second switch for reading said path metric data from said two systems of memories to distribute and output to said ACS execution circuit.

11. The Viterbi decoder as set forth in claim 9, wherein said ACS execution circuit comprises as many ACS blocks as the number corresponding to said multiplicity which execute ACS processing of adding said branch metrics received from said branch metric generation circuit and said path metric data read from said path metric holding circuit, comparing addition results and selecting a smaller path.

12. The Viterbi decoder as set forth in claim 9, wherein said ACS execution circuit comprises as many ACS blocks as the number corresponding to said multiplicity which execute ACS processing of adding said branch metrics received from said branch metric generation circuit and said path metric data read from said path metric holding circuit, comparing addition results and selecting a smaller path, and said path metric holding circuit comprising two systems of memories for storing said path metric data, a first switch for writing said path metric data output from said ACS execution circuit divisionally to said two systems of memories, and a second switch for reading said path metric data from said two systems of memories to distribute to said ACS blocks of said ACS execution circuit.

13. The Viterbi decoder as set forth in claim 9, wherein said ACS execution circuit comprises, as many as the number corresponding to said multiplicity, an addition circuit for adding said branch metrics received from said branch metric generation circuit and said path metric data read from said path metric holding circuit, and a comparison and selection circuit for comparing addition results obtained by said addition circuit to select a smaller path, said addition circuit and said comparison and selection circuit executing processing in parallel to each other.

14. The Viterbi decoder as set forth in claim 9, wherein said ACS execution circuit comprises, as many as the number corresponding to said multiplicity, an addition circuit for adding said branch metrics received from said branch metric generation circuit and said path metric data read from said path metric holding circuit, and a comparison and selection circuit for comparing addition results obtained by said addition circuit to select a smaller path, said addition circuit and said comparison and selection circuit executing processing in parallel to each other, and said path metric holding circuit comprising two systems of memories for storing said path metric data, a first switch for writing said path metric data output from said ACS execution circuit divisionally to said two systems of memories, and a second switch for reading said path metric data from said two systems of memories to distribute to said addition circuit of said ACS execution circuit.

* * * * *